(12) United States Patent
Fujioka et al.

(10) Patent No.: US 11,647,612 B2
(45) Date of Patent: May 9, 2023

(54) HIGH-DENSITY INTEGRATED POWER ELECTRONIC ASSEMBLY INCLUDING DOUBLE-SIDED COOLING STRUCTURE

(71) Applicant: Toyota Motor Engineering & Manufacturing North America, Inc., Plano, TX (US)

(72) Inventors: Hitoshi Fujioka, Ann Arbor, MI (US); Shailesh N. Joshi, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 17/164,268

(22) Filed: Feb. 1, 2021

(65) Prior Publication Data

US 2022/0167524 A1    May 26, 2022

Related U.S. Application Data

(60) Provisional application No. 63/117,151, filed on Nov. 23, 2020.

(51) Int. Cl.
*H05K 7/20*        (2006.01)
*H02M 7/00*        (2006.01)
*H01L 23/427*      (2006.01)

(52) U.S. Cl.
CPC ......... *H05K 7/209* (2013.01); *H05K 7/20309* (2013.01); *H05K 7/20318* (2013.01); *H05K 7/20336* (2013.01); *H05K 7/20909* (2013.01); *H05K 7/20936* (2013.01); *H01L 23/427* (2013.01); *H02M 7/003* (2013.01)

(58) Field of Classification Search
CPC .......... H05K 7/20936; H05K 7/20881; H05K 7/20909; H05K 7/209; H05K 7/20309; H05K 7/20318; H05K 7/20336; H02M 7/003; H01L 23/473; H01L 23/427
See application file for complete search history.

(56) References Cited

U.S. PATENT DOCUMENTS

| | | | |
|---|---|---|---|
| 7,015,578 B2 * | 3/2006 | Nakamura | H01L 25/112 257/713 |
| 7,099,153 B2 | 8/2006 | Tazawa | |
| 7,381,383 B1 | 6/2008 | Yokoyama et al. | |
| 7,796,389 B2 * | 9/2010 | Edmunds | F28D 15/0233 361/679.52 |

(Continued)

FOREIGN PATENT DOCUMENTS

| | | |
|---|---|---|
| CN | 201893686 U | 7/2011 |
| DE | 102016224371 A1 | 6/2018 |

(Continued)

*Primary Examiner* — Zachary Pape
(74) *Attorney, Agent, or Firm* — Dinsmore & Shohl LLP

(57) ABSTRACT

An integrated power electronic assembly includes a power electronic device, a cooling assembly offset from and thermally coupled to a second edge of the power electronic device, and a thermal spreader offset from and thermally coupled to a first edge of the power electronic device. The first edge of the power electronic device is opposite the second edge of the power electronic device, and the thermal spreader is thermally coupled to the cooling assembly.

16 Claims, 8 Drawing Sheets

(56) References Cited

U.S. PATENT DOCUMENTS

| | | | | |
|---|---|---|---|---|
| 7,973,387 B2 * | 7/2011 | Flett | ................ | H01L 23/473 |
| | | | | 257/370 |
| 9,192,043 B2 * | 11/2015 | Farner | ................ | H05K 3/0061 |
| 10,424,970 B2 | 9/2019 | Zhang | | |
| 10,615,096 B2 * | 4/2020 | Yamagata | ............ | H01L 23/3731 |
| 2015/0258946 A1 | 9/2015 | Namudur et al. | | |
| 2015/0354901 A1 * | 12/2015 | Moore | ................ | F28D 15/04 |
| | | | | 165/104.21 |
| 2020/0132392 A1 | 4/2020 | Joshi | | |

FOREIGN PATENT DOCUMENTS

| | | | | |
|---|---|---|---|---|
| JP | 4192396 B2 * | 12/2008 | ......... | H01L 23/4006 |
| WO | WO-2009150875 A1 * | 12/2009 | ........... | H01L 23/642 |

\* cited by examiner

HIGH-DENSITY INTEGRATED POWER ELECTRONIC ASSEMBLY INCLUDING DOUBLE-SIDED COOLING STRUCTURE

CROSS-REFERENCE TO RELATED APPLICATIONS

This application claims the benefit of U.S. Provisional Application No. 63/117,151 filed Nov. 23, 2020, the entirety of which is incorporated by reference herein.

TECHNICAL FIELD

The present specification generally relates to high density integrated power electronic assemblies, and in particular, to high density power electronic assemblies that include double-sided cooling structures capable of removing heat from a first and second surface of a power electronic device of the power electronic assembly.

BACKGROUND

Conventional motor drive systems in electrified vehicles (e.g., hybrid electric vehicles, plug-in hybrid vehicles, fuel cell vehicles, and electric vehicles) consist of power electronic assemblies that act as inverters for the vehicle. The power electronic devices (e.g. insulated-gate bipolar transistors (IGBT) or metal-oxide-semiconductor field-effect transistor (MOSFET)) of the power electronic assemblies are typically physically separated from the gate drive devices and capacitors that control the operation of the power electronic devices. However, the traditional, spaced power electronic assemblies result in large power electronic packages that occupy an undesirably large volume in the electrified vehicle and experience large amounts of parasitic inductance. High-density integrated power electronic assemblies, including power electronic devices, gate drive devices, and capacitors in a tightly packed structure, reduce the volumetric footprint of the power electronic assemblies and reduce the amount of parasitic inductance in the power electronic assemblies. However, the high-density integrated power electronics assemblies also result in high operating temperatures in excess of 200° C., for instance.

Accordingly, a need exists for high-density integrated power electronic assemblies including integrated cooling structures that effectively dissipate heat from the power electronic assemblies, thereby preventing any thermal-related damage to the power electronic assemblies, and particularly to the power electronic devices of the assemblies.

SUMMARY

In one embodiment, an integrated power electronic assembly includes a power electronic device, a cooling assembly offset from and thermally coupled to a second edge of the power electronic device, and a thermal spreader offset from and thermally coupled to a first edge of the power electronic device. The first edge of the power electronic device is opposite the second edge of the power electronic device, and the thermal spreader is thermally coupled to the cooling assembly.

In another embodiment, an integrated power electronic assembly includes a first power electronic device, a second power electronic device, a cooling assembly offset from second edges of the first and second power electronic devices, gate drive electronics offset from first edges of the first and second power electronic devices, where the first edges are opposite the second edges, and a thermal spreader. The thermal spreader further includes a first portion coupled to the gate drive electronics, a second portion coupled to the cooling assembly, and a third portion coupled between the first portion and the second portion.

In yet another embodiment, an integrated power electronic assembly includes a power electronic device, a cooling assembly offset from a first edge of the power electronic device, gate drive electronics offset from a second edge of the power electronic device, where the first edge is opposite the second edge, and a heat pipe. The heat pipe includes a first portion positioned between the gate drive electronics and the first edge of the power electronic device, where a coolant transitions from a liquid to a vapor in the first portion, a second portion positioned between the cooling assembly and the second edge of the power electronic device, where the coolant transitions from a vapor to a liquid in the second portion, and a third portion coupled between the first portion and the second portion, where the coolant is wicked between the first portion and the second portion through the third portion.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
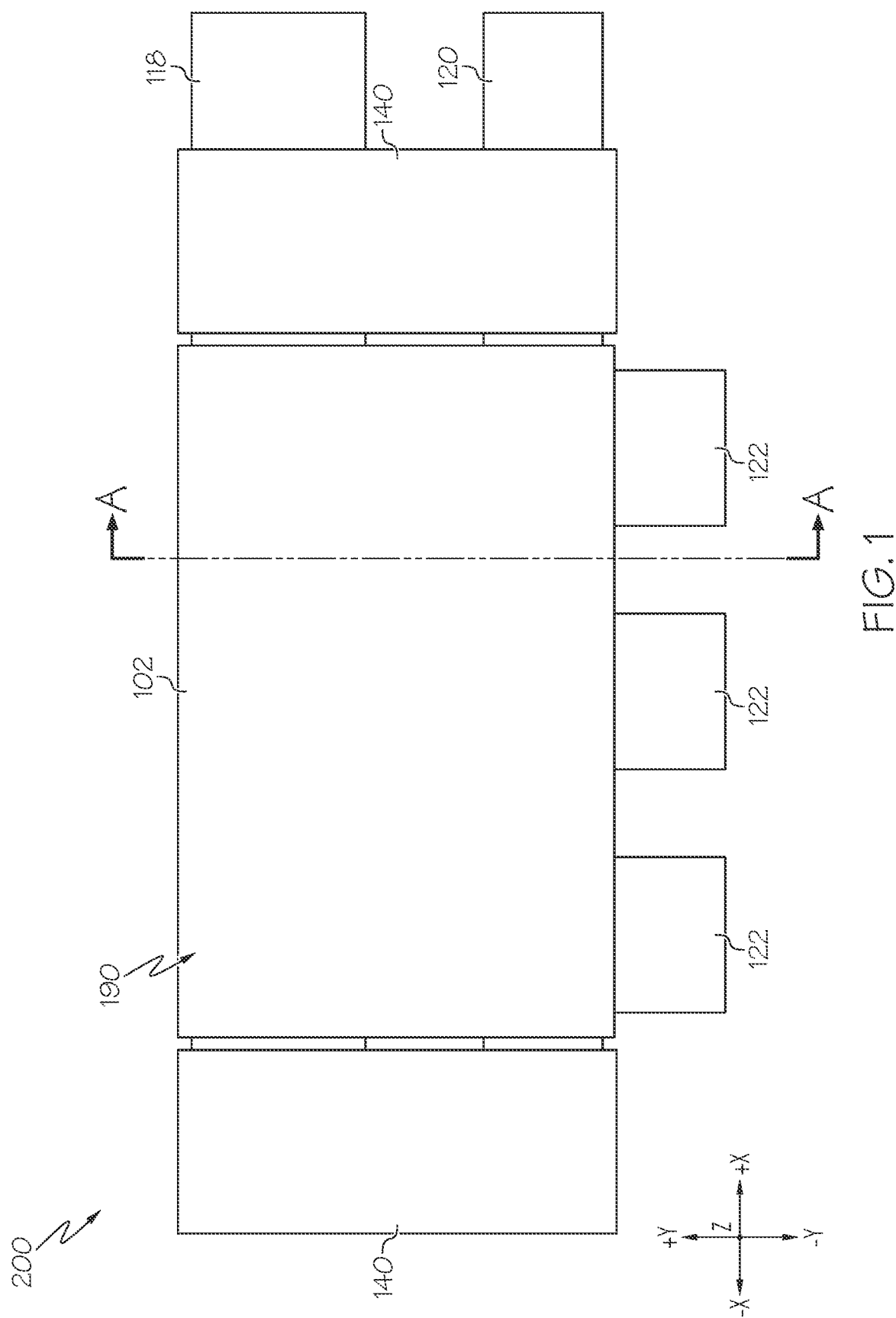
FIG. 1 schematically depicts a power electronic assembly, according to one or more embodiments shown and described herein.

Embodiments described herein are directed to a high-density power electronic assembly that include one or more power modules. The power modules act as inverters, converting direct current input to the power modules from a battery to alternating current output from the power modules to a motor. The power modules include one or power electronic, or switching, devices and gate drive electronics that are tightly packed in the power modules to reduce the volumetric footprint of the power electronic assembly. One or more thermal spreaders conveys heats from both the top and bottom surfaces of the power modules to a cooling structure of the power electronic assembly. More specifically, the thermal spreaders are configured to convey heat from the gate drive electronics and the top and bottom surfaces of the power electronic devices to the cooling assembly. The cooling assembly then dissipates heat from the power modules and power electronic assembly such that the power electronic assembly is maintained at an ideal operating temperature. Various embodiments of the power electronic assembly and the operation of the power electronic assembly are described in more detail herein. Whenever possible, the same reference numerals will be used throughout the drawings to refer to the same or like parts.

Figure 2:
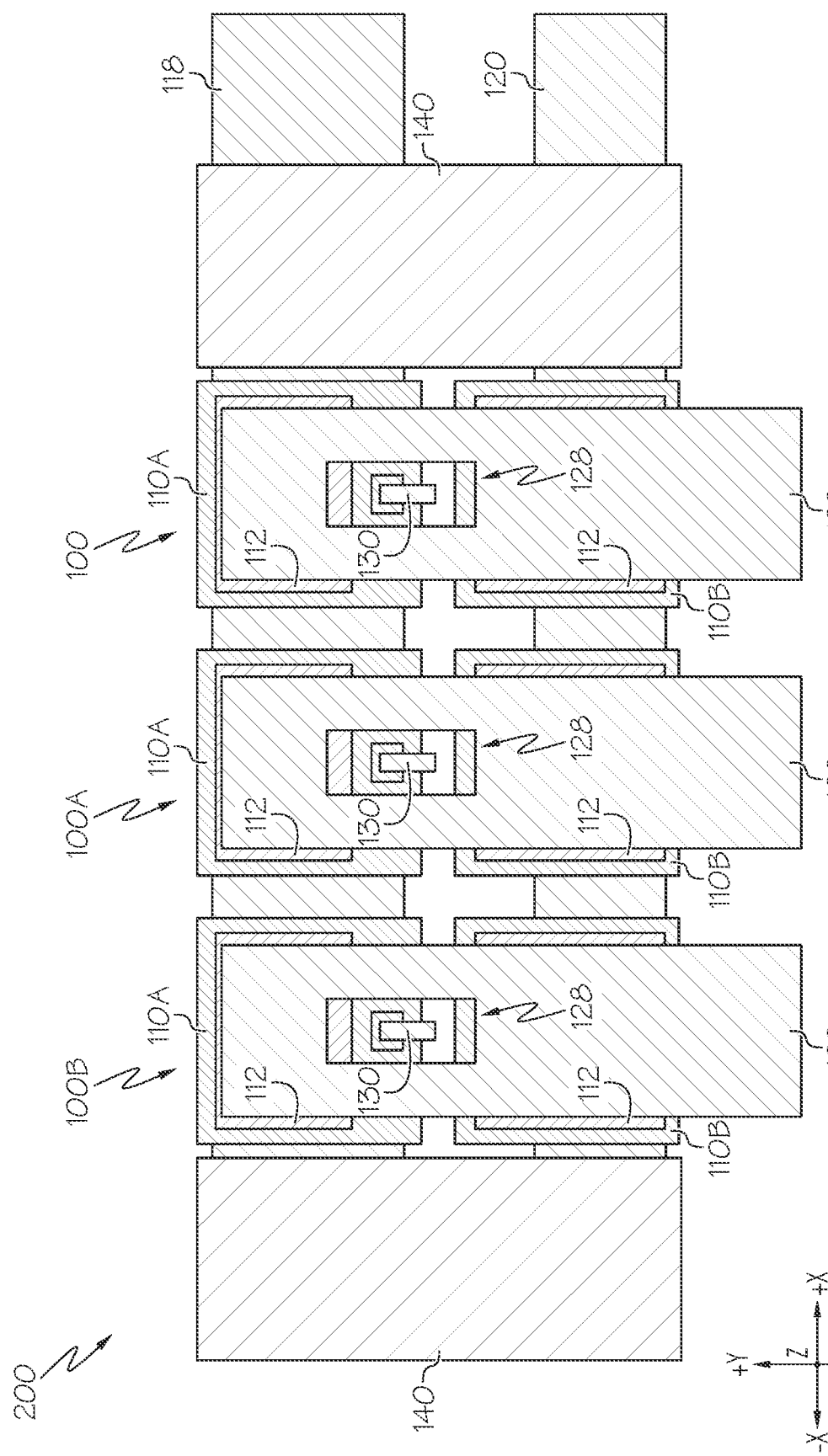
FIG. 2 schematically depicts the power electronic assembly of FIG. 1 isolated from a cooling assembly.

Referring now to FIGS. 1 and 2, a top view of a power electronic assembly 200 is depicted. The power electronic assembly 200 includes a first power module 100, a second power module 100A, and a third power module 100B. In FIG. 2, a cooling assembly 190, as well as additional power module components such as the second electric insulation layer 114B (FIG. 3), are removed from the power electronic assembly 200 of FIG. 1 to depict the first power module 100, the second power module 100A, and the third power module 100B. The cooling assembly 190 may be a shared cooling assembly across the power modules 100, 100A, and 100B, as depicted in FIG. 1. In other embodiments, a separate cooling assembly 190 may be coupled to each of the power modules 100, 100A, and 100B. The power modules 100, 100A, 100B, may take the configuration of any of the power modules discussed with references to FIGS. 3-9 herein. In embodiments, each power module 100, 100A, 100B of the power electronic assembly 200 may take the same form. In other embodiments, any combination of power modules discussed with references to FIGS. 3-9 may be implemented in the power electronic assembly 200 as the power modules 100, 100A, 100B. Input busbars 118, 120 are continuous throughout the power electronic assembly 200. In other words, the input busbars 118, 120 extend through and are shared by the power modules 100, 100A, and 100B. The input busbars provide direct current (DC) from a battery to the power modules 100, 100A, 100B of the power electronic assembly 200. The power electronic assembly 200 includes one or more capacitors electrically coupled to and extending across the input busbars 118, 120. The one or more capacitors 140 are operable to smoothen and balance any voltage oscillations of the DC input current from the battery such that power electronic devices 110A, 110B of the power electronic assembly 200 can operate optimally to produce alternating current (AC) output. In some embodiments, the cooling assembly 190 may extend across the power modules 100, 100A, 100B and the one or more capacitors 140. In other embodiments, in which a separate cooling assembly 190 cools each power module 100, 100A, 100B, the one or more capacitors 140 may share a cooling assembly 190 with an adjacent power module. In yet other embodiments, the one or more capacitors 140 may be cooled by separate cooling means from the cooling assembly 190.

The power electronic assembly 200 may function as an inverter for a three-phase (U, V, W) electric motor. The power electronic assembly 200 converts DC voltage into three sinusoidal AC waves of equal amplitude in three different phases, U, V, and W, using pulse width modulation for the motor. More specifically, each of the power modules 100, 100A, 100B of the power electronic assembly 200 receives input from a power source, such as a battery, through the input busbars 118, 120. Each power module 100, 100A, 100B corresponds to one of the U, V, and W phases of the motor. For instance, the power module 100 may invert the DC input to a U-phase AC output, the power module 100A may invert the DC input to a V-phase AC output, and the power module 100B may invert the DC input to a W-phase AC output. Output busbars 122 of each of the power modules 100, 100A, 100B may then provide the respective U, V, or W AC outputs to the electric motor.

Figure 3:
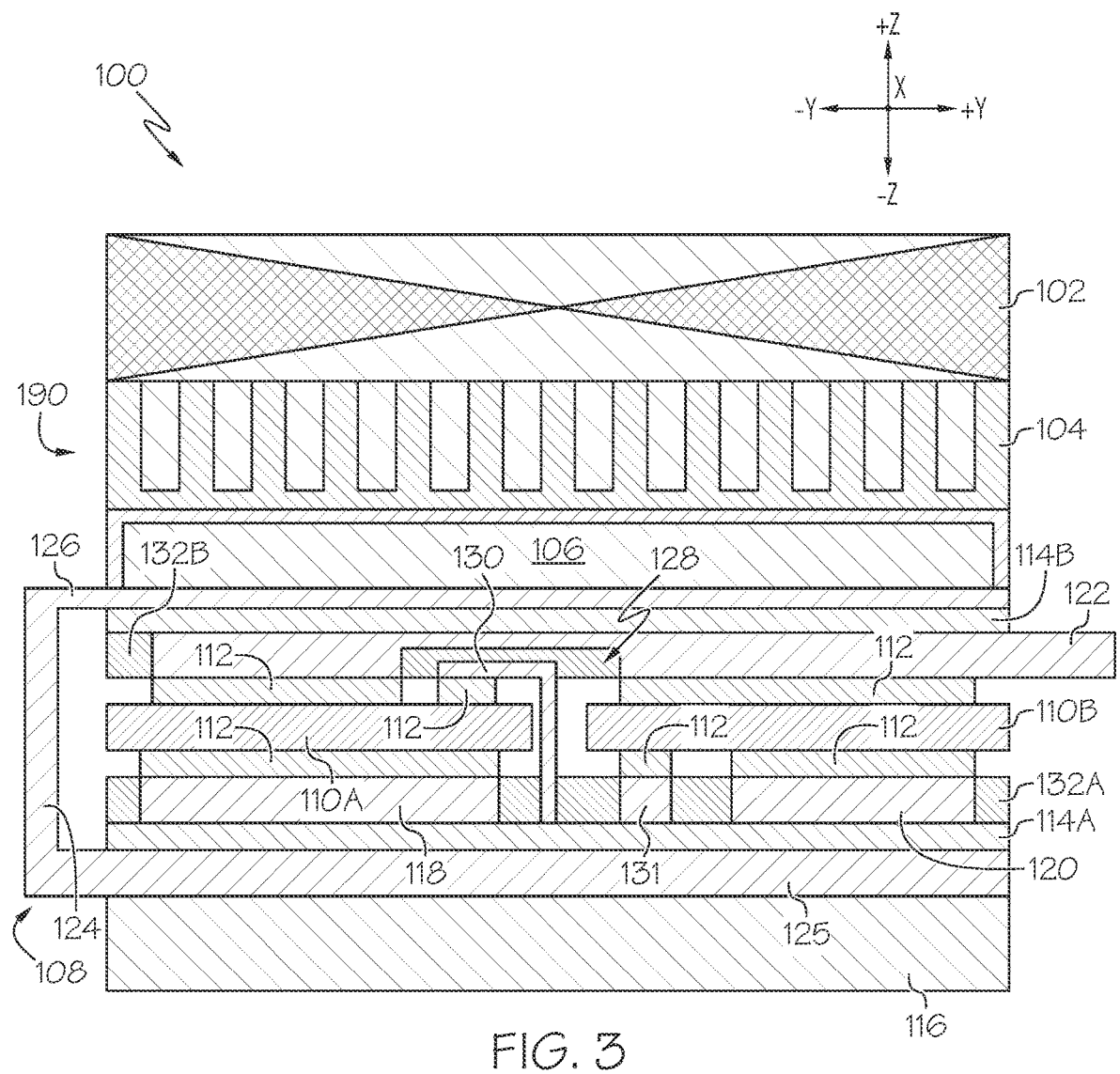
FIG. 3 schematically depicts a cross section of a power module of the power electronic assembly of FIG. 1 taken along line A-A, according to one or more embodiments shown and described herein.

Referring now to FIG. 3, a cross-sectional view of the power module 100 of the integrated power electronic assembly 200, taken along line A-A of FIG. 1, is schematically depicted. The power module 100 includes one or more power electronics devices 110A, 110B. The one or more power electronics devices 110A, 110B may be a switching semiconductor device, such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the power electronic devices 110A, 110B may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, power electronic devices 110A, 110B operate at high current and under high temperatures, for example in excess of 250° C., and generate a large amount of heat that must be removed for the continued operation of the integrated power electronic assembly 200. In embodiments, the power electronic device 110A and the power electronic device 110B may be positioned in the same horizontal plane. In other words, the power electronic devices 110A and 110B may be positioned at substantially the same vertical point (e.g. in the direction of the z-axis of the coordinate axes of FIG. 3). In other embodiments, the power electronic devices 110A and 110B may be vertically offset (e.g. in the direction of the z-axis of the coordinate axes of FIG. 3). In embodiments, the power electronic device 110A and the power electronic device 110B may be horizontally offset (e.g. in the direction of the y-axis of the coordinate axes of FIG. 3). The power electronic devices 110A and 110B may be aligned in vertically opposite directions (e.g physically flipped in orientation along the z-axis of the coordinate axes of FIG. 3), such that the gates of the of power electronic devices 110A and 110B are positioned on opposite surfaces of the respective power electronic devices 110A, 110B, thereby reducing power electronic assembly 200 (FIG. 1) packaging size and increasing power electronic assembly 200 (FIG. 1) packing density.

Still referring to FIG. 3, the power module 100 includes an output busbar 122 and input busbars 118, 120. The use and arrangement of busbars 118, 120, 122 contributes to the compact packaging of the power electronic assembly 200 (FIG. 1) that reduces power loss, voltage spikes, and gate loop inductance, while also helping dissipate the heat generated during the operation of the power electronic assembly 200 (FIG. 1). The busbars 118, 120, 122 may be formed from an electrically conductive material such as, but not limited to, copper, aluminum, nickel, and the like. The input busbars 118, 120 provide the power module 100 with a DC signal, which is therein converted to an AC signal and outputted through the output busbar 122. The input busbar 118 may also be referred to as the P busbar and connects to a positive terminal of a battery. The P busbar 118 is electrically coupled to the power electronic device 110A. The input busbar 120 may also be referred to as the N busbar and connects to a negative terminal of a battery. The N busbar 120 is electrically coupled to the power electronic device 110B. The output busbar 122 may also be referred to as the O busbar and connects to and provides alternating current to a motor.

The P busbar 118 may be bonded to the power electronic device 110A with one or more bonding agents 112, such as but not limited to, copper bonding paste or solder. More specifically, the P busbar 118 may be bonded to the power electronic device 110A at a bottom surface (e.g. in the −z direction of the coordinate axes of FIG. 3) of the power electronic device 110A with the one or more bonding agents 112. The O busbar 122 may be bonded to the power electronic device 110A with the one or more bonding agents 112 at a top surface (e.g. in the +z direction of the coordinate axes of FIG. 3) of the power electronic device 110A.

The N busbar 120 may be bonded to the power electronic device 110B with the one or more bonding agents 112. More specifically, the N busbar 120 may be bonded to the power electronic device 110B at a bottom surface (e.g. in the −z direction of the coordinate axes of FIG. 3) of the power electronic device 110B with the one or more bonding agents 112. The O busbar 122 may be bonded to the power electronic device 110B with the one or more bonding agents 112 at a top surface (e.g. in the +z direction of the coordinate axes of FIG. 3) of the power electronic device 110B.

The power module 100 may include one or more layers of mold resin. The mold resin may house one or more components of the power module 100. A first layer of mold resin 132A may be positioned beneath (e.g. in the −z direction of the coordinate axes of FIG. 3) the power electronic devices 110A, 110B such that the P busbar 118 and the N busbar 120 are positioned in the first layer of mold resin 132A. A second layer of mold resin 132B may be positioned above (e.g. in the +z direction of the coordinate axes of FIG. 3) the power electronic devices 110A, 110B such that the O busbar 122 is positioned in the second layer of mold resin 132B.

Still referring to FIG. 3, the power module 100 may further include gate drive electronics 116 electrically coupled to the power electronic devices 110A, 110B. The gate drive electronics 116 may include one or more gate drivers. For instance, a first gate driver may be electrically coupled to the power electronic device 110A, and a second gate driver may be electrically coupled to the power electronic device 110B. As such, the gate drive electronics 116 may operably control power electronic devices 110A, 110B.

The gate drive electronics 116 may be coupled to the power electronic devices 110A, 110B with one or more electrically conductive vias. In embodiments, the power electronic device 110A may be oriented such that the gate of the power electronic device 110A is positioned on a top surface (e.g. in the +z direction of the coordinate axes of FIG. 3) of the power electronic device 110A. An L-shaped via 130 may electrically couple the gate drive electronics 116 to the gate of the power electronic device 110A. More specifically, a first vertical portion of the L-shaped via 130 may extend from a top surface (e.g. in the +z direction of the coordinate axes of FIG. 3) of the gate drive electronics 116. The first vertical portion of the L-shaped via 130 may extend through the first layer of mold resin 132A and into the second layer of mold resin 132B. The first vertical portion of the L-shaped via may traverse an interior space, or an interior cavity of the power module 100. More specifically, L-shaped via 130 may extend between the power electronic device 110A and the power electronic device 110B. In doing so, the L-shaped via 130 may also extend between the P busbar 118 and the N busbar 120 and the bonding agents 112 bonding the power electronic device 110A to the P busbar 118 and the O busabr 122 and bonding the power electronic device 110B to the N busbar 120 and the O busbar 122, respectively. A second horizontal portion of the L-shaped via 130 may then extend horizontally (e.g. in the direction of the y-axis of the coordinate axes of FIG. 3) through the second layer of mold resin 132B toward the power electronic device 110A. One or more bonding agents 112, such as solder, may then couple the L-shaped via 130 to the top surface (e.g. in the +z direction of the coordinate axes of FIG. 3) of the power electronic device 110A. The O busbar 122 may further comprise an internal cutout 128 that is sized to accommodate the L-shaped via 130 and allow the L-shaped via 130 to extend through the interior of the power module 100 to electrically couple to the gate of the power electronic device 110A.

In embodiments, the power electronic device 110B may be oriented such that the gate of the power electronic device 110B is positioned on a bottom surface (e.g. in the −z direction of the coordinate axes of FIG. 3) of the power electronic device 110B. A via 131 may electrically couple the gate drive electronics 116 to the gate of the power electronic device 110B. More specifically, the via 131 may extend from a top surface (e.g. in the +z direction of the coordinate axes of FIG. 3) of the gate drive electronics 116 through the first layer of mold resin 132A. One or more bonding agents 112, such as solder, may then couple the via 131 to the bottom surface (e.g. in the −z direction of the coordinate axes of FIG. 3) of the power electronic device 110B.

Still referring to FIG. 3, the power module 100 may include one or more electrical insulation layers. The one or more electrical insulation layers may be a metal oxide, such as, but not limited to, copper oxide. The one or more electrical insulation layers may at least partially surround the power electronic devices 110A, 110B, the input busbars 118, 120, and the output busbar 122. For instance, a first electrical insulation layer 114A may be coupled to the bottom surfaces (e.g. in the −z direction of the coordinate axes of FIG. 3) of the P busbar 118 and N busbar 120. The first electrical insulation layer 114A may horizontally extend (e.g. in the direction of the y-axis of the coordinate axes of FIG. 3) substantially across the entire power module 100 such that the electrical insulation layer 114A entirely extends across the P busbar 118, the N busbar 120, and the first layer of mold resin 132A. A second electrical insulation layer 114B may be coupled to the top surface (e.g. in the +z direction of the coordinate axes of FIG. 3) of the O busbar 122, and horizontally extend (e.g. in the direction of the y-axis of the coordinate axes of FIG. 3) substantially the same distance as the first electrical insulation layer 114A.

Still referring to FIG. 3, the power module 100 may include a thermal spreader 108. The thermal spreader 108 may be any thermally conductive material, such as, but not limited to, copper, aluminum, nickel, copper-graphite, aluminimum-graphite, and/or alloys thereof. The thermal spreader 108 may also be fabricated from a thermally-enhanced polymer composite having thermal conductivity greater than 100 W/m*K. The thermal spreader 108 includes a heat-spreading structure for directionally transferring heat generated by the power electronic devices 110A, 110B and gate drive electronics 116 toward the cooling assembly 190. The effective thermal conductivity of the thermal spreader 108 may be about 800-1000 W/m*K. In other embodiments, as described in detail below, the thermal spreader 108 may have a heat-spreading structure including one or more embedded heat pipes or vapor chambers.

The thermal spreader 108 includes a first portion 125. The first portion 125 of the thermal spreader may be positioned between the power electronic devices 110A, 110B and the gate drive electronics 116, and in particular, between the first electrical insulation layer 114A and the gate drive electronics 116. More specifically, the first portion 125 of the thermal spreader 108 may be positioned between the bottom surfaces (e.g. in the −z direction of the coordinate axes of FIG. 3) of the power electronic devices 110A, 110B and the top surface (e.g. in the +z direction of the coordinate axes of FIG. 3) of the gate drive electronics 116. The first portion 125 may extend at least across substantially the entire width (e.g. in the direction of the y-axis of the coordinate axes of FIG. 3) of the power module 100. More specifically, the first portion 125 may continuously extend from a leftmost edge (e.g. in the −y direction of the coordinate axes of FIG. 3) of the power electronic device 110A to a rightmost edge (e.g. in the +y direction of the coordinate axes of FIG. 3) of the power electronic device 110B. In such embodiments, the first portion 125 of the thermal spreader 108 extends across the entire bottom surfaces (e.g. in the −z direction of the coordinate axes of FIG. 3) of the power electronic devices 110A, 110B and any horizontal gap, cavity, or spacing (e.g. in the direction of the y-axis of the coordinate axes of FIG. 3) between the power electronic devices 110A, 110B. The first portion 125 of the thermal spreader 108 may be thermally coupled to one or more components of the power module 100. For instance, the first portion 125 may draw heat from the gate drive electronics 116, the power electronic devices 110A, 110B, the P busbar 118, the N busbar 120, vias 130, 131, and any other components of the power module 100. The first portion 125 of the thermal spreader 108 is particularly positioned to be thermally coupled to and draw heat from the power electronic devices 110A, 110B and the gate drive electronics 116, active components of the power module 100 that generate large amounts of heat. More specifically, being positioned from the bottom surfaces (e.g. in the −z direction of the coordinate axes of FIG. 3) of the power electronic devices 110A, 110B, the first portion 125 of the thermal spreader 108 is positioned to draw heat from the bottom surfaces (e.g. in the −z direction of the coordinate axes of FIG. 3) of the power electronic devices 110A, 110B.

The thermal spreader 108 further includes a second portion 126. The second portion 126 of the thermal spreader may be positioned between the power electronic devices 110A, 110B and the cooling assembly 190, and in particular, between the second electrical insulation layer 114B and a vapor chamber 106 of the cooling assembly 190. More specifically, the second portion 126 of the thermal spreader 108 may be positioned between the top surfaces (e.g. in the +z direction of the coordinate axes of FIG. 3) of the power electronic devices 110A, 110B and the bottom surface (e.g. in the −z direction of the coordinate axes of FIG. 3) of the cooling assembly 190, or specifically vapor chamber 106. The second portion 126 may extend at least across substantially the entire width (e.g. in the direction of the y-axis of the coordinate axes of FIG. 3) of the power module 100. More specifically, the second portion 126 may continuously extend from a leftmost edge (e.g. in the −y direction of the coordinate axes of FIG. 3) of the power electronic device 110A to a rightmost edge (e.g. in the +y direction of the coordinate axes of FIG. 3) of the power electronic device 110B. In such embodiments, the second portion 126 of the thermal spreader 108 extends across the entire top surfaces (e.g. in the +z direction of the coordinate axes of FIG. 3) of the power electronic devices 110A, 110B and any horizontal gap, cavity, or spacing (e.g. in the direction of the y-axis of the coordinate axes of FIG. 3) between the power electronic devices 110A, 110B. The second portion 126 of the thermal spreader 108 may be thermally coupled to one or more components of the power module 100. For instance, the second portion 126 may draw heat from the power electronic devices 110A, 110B, the O busbar 122, the L-shaped via 130, and any other components of the power module 100. Being positioned from the top surfaces (e.g. in the +z direction of the coordinate axes of FIG. 3) of the power electronic devices 110A, 110B, the second portion 126 of the thermal spreader 108 is particularly positioned to draw heat from the top surfaces (e.g. in the +z direction of the coordinate axes of FIG. 3) of the power electronic devices 110A, 110B.

The thermal spreader 108 further includes a third portion 124. The third portion 124 couples the first portion 125 to the second portion 126 of the thermal spreader 108. More specifically, the third portion 124 of the thermal spreader 108 thermally couples the first portion 125 to the second portion 126. Through the third portion 124 of the thermal spreader 108, the first portion 125 of the thermal spreader 108 may transmit or convey heat to the second portion 126. In other words, the first portion 125 is able to draw heat from the gate drive electronics 116, positioned at the bottom (e.g. in the −z direction of the coordinate axes of FIG. 3) of the power module 100, and the bottom surfaces (e.g. in the −z direction of the coordinate axes of FIG. 3) of the power electronic devices 110A, 110B and convey the drawn heat to the second portion 126 positioned above (e.g. in the +z direction of the coordinate axes of FIG. 3) the power electronic devices 110A, 110B. The third portion 124 of the thermal spreader 108 may be laterally positioned (e.g. in the direction of the y-axis of the coordinate axes of FIG. 3) from the power electronic device 110A or the power electronic device 110B. In other words, in embodiments, the third portion 124 may be nearest to the left-most edge (e.g. in the −y direction of the coordinate axes of FIG. 3) of the power electronic device 110A and farthest from the right-most edge (e.g. in the +y direction of the coordinate axes of FIG. 3) of the power electronic device 110B. In other embodiments, the third portion 124 may be nearest to the right-most edge (e.g. in the +y direction of the coordinate axes of FIG. 3) of the power electronic device 110B and farthest from the left-most edge (e.g. in the −y direction of the coordinate axes of FIG. 3) of the power electronic device 110A. In yet other embodiments, the components of the power module 100 may be particular sized and shaped for the third portion 124 to extend from the first portion 125 to the second portion 126 of the thermal spreader 108 at a point between the left-most edge (e.g. in the −y direction of the coordinate axes of FIG. 3) of the power electronic device 110A and the right-most edge (e.g. in the +y direction of the coordinate axes of FIG. 3) of the power electronic device 110B. For instance, the third portion 124 may extend through an internal cavity of the power module 100 similar to the L-shaped via 130. In other words, the third portion 124 may extend between the power electronic devices 110A, 110B and through the internal cutout 128 of the O busbar 122.

Still referring to FIG. 3, and as mentioned above, the thermal spreader 108, and particularly the second portion 126 of the thermal spreader 108 is physically and thermally coupled to the cooling assembly 190. The cooling assembly 190 may include one or more of the vapor chamber 106, a heat sink 104, and a fan 102.

The vapor chamber 106 may be mechanically and thermally coupled to the second portion 126 of the thermal spreader 108. More specifically, the bottom surface (e.g. in the −z direction of the coordinate axes of FIG. 3) of the vapor chamber 106 may be positioned on the top surface (e.g. in the +z direction of the coordinate axes of FIG. 3) of the second portion 126 of the thermal spreader 108. As such, the second portion 126 of the thermal spreader 108 conveys heat from the power electronic devices 110A, 110B, gate drive electronics 116, and other components of the power module 100 to the vapor chamber 106. The vapor chamber 106 functions as a two-phase cooler. A coolant of the vapor chamber 106 changes from a liquid to a gas when heated from the second portion 126 of the thermal spreader 108. The coolant, in vapor form, then condenses to a liquid on a condenser plate of the vapor chamber 106. The condenser plate of the vapor chamber 106 may be positioned toward a top surface (e.g. in the +z direction of the coordinate axes of FIG. 3) of the vapor chamber 106. The coolant, condensing on the condenser plate of the vapor chamber 106, thermally transfers the heat initially absorbed form the second portion 126 of the thermal spreader 108 to the top surface (e.g. in the +z direction of the coordinate axes of FIG. 3) of the vapor chamber 106.

The heat sink 104 is mechanically and thermally coupled to the vapor chamber 106. More specifically, a bottom surface (e.g. in the −z direction of the coordinate axes of FIG. 3) of the heat sink 104 may be positioned on the top surface (e.g. in the +z direction of the coordinate axes of FIG. 3) of the vapor chamber 106. The heat sink 104 may be any thermally conductive material, such as aluminum, copper, and the like, and is particularly configured to transfer heat from its base to a fluid, such as air or liquid coolant, surrounding and passing through the heat sink 104. For instance, the heat sink 104 may include a plurality of fins with air disposed between the plurality of fins. The heat sink 104 therefore draws heat from the vapor chamber 106 and specifically conveys the heat to the gas or other fluid contacting the plurality of surfaces of the heat sink 104.

The fan 102 is mechanically and thermally coupled to the heat sink 104. More specifically, the fan 102 may be positioned on the top surface (e.g. in the +z direction of the coordinate axes of FIG. 3) of the heat sink 104. The fan 102 increases the flow of air or other cooling fluid over and throughout the heat sink 104. Therefore, air within the heat sink 104 that has been heated through contact with the heat sink 104 is driven from the heat sink 104 and away from the power module 100 by the fan 102. Moreover, the fan 102 drives external, cool air for further cooling of the heat sink 104 and power module 100 into the heat sink 104.

Still referring to FIG. 3, the arrangement of the multiple components of the power module 100, therefore, allows for double-sided cooling of the power module 100, and particularly of the power electronic devices 110A, 110B. The thermal spreader 108 is thermally coupled to and draws heat from both the tops (e.g. in the +z direction of the coordinate axes of FIG. 3) and the bottoms (e.g. in the −z direction of the coordinate axes of FIG. 3) of the power electronic devices 110A, 110B. The cooling assembly 190 is thermally coupled to the second portion 126 of the thermal spreader 108. Therefore, the cooling assembly 190 dissipates heat from the top surfaces (e.g. in the +z direction of the coordinate axes of FIG. 3) of the power electronic devices 110A, 110B in direct thermal communication with the second portion 126 of the thermal spreader 108. Moreover, the cooling assembly 190 generates a thermal gradient that draws heat from the first portion 125 to the second portion 126. Therefore, the cooling assembly 190 dissipates heat from the gate drive electronics 116 and the bottom surfaces (e.g. in the −z direction of the coordinate axes of FIG. 3) of the power electronic devices 110A, 110B, which are in direct thermal communication with the first portion 125 of the thermal spreader 108, which is in further thermal communication with the second portion 126 of the thermal spreader 108.

Still referring to FIG. 3, it should be appreciated that one or more grease layers may be disposed between one or more components of the power module 100, and particularly the cooling assembly 190, such that thermal communication between any two adjoining members is increased. It should also be appreciated that while the preceding discussion regarding the power module 100 was had with specific reference to the spatial orientation displayed in FIG. 3, that the power module 100 need not be arranged exactly as depicted and discussed. For instance, while the cooling assembly 190 has been described as being vertically (e.g. in the direction of the z-axis of the coordinate axes of FIG. 3) arranged such that the vapor chamber 106 is nearest the second portion 126 of the thermal spreader 108, the fan 102 is farthest from the second portion 126, and the heat sink 104 is disposed between the vapor chamber 106 and the fan 102, the components of the cooling assembly 190 can be rearranged from the second portion 126 is any desirable order. Merely as an example, the cooling assembly 190 can be arranged such that the heat sink 104 is nearest second portion 126 of the thermal spreader 108, the fan 102 is farthest from the second portion 126, and the vapor chamber 106 is disposed between the heat sink 104 and the fan 102. Furthermore, while the power module 100 has been described as being double-sided cooled in the upward vertical direction (e.g. in the +z direction of the coordinate axes of FIG. 3), the particular direction and orientation of the double-sided cooling can be desirably adjusted. In other words, in some embodiments, the cooling assembly 190 may be coupled to the first portion 125 of the thermal spreader, and the gate drive electronics 116 may be positioned on the second portion 126 of the thermal spreader 108. In such embodiments, heat may generally be drawn from the top (e.g. in the +z direction of the coordinate axes of FIG. 3) of the power module to the exterior component of the cooling assembly 190 (e.g. in the −z direction of the axes of FIG. 3). Similarly, the thermal spreader 108 and the cooling assembly 190 may be arranged in the power module 100 such that heat is generally conveyed through and dissipated from the power module 100 horizontally (e.g. in the direction of the y-axis of the coordinate axes of FIG. 3).

Figure 4:
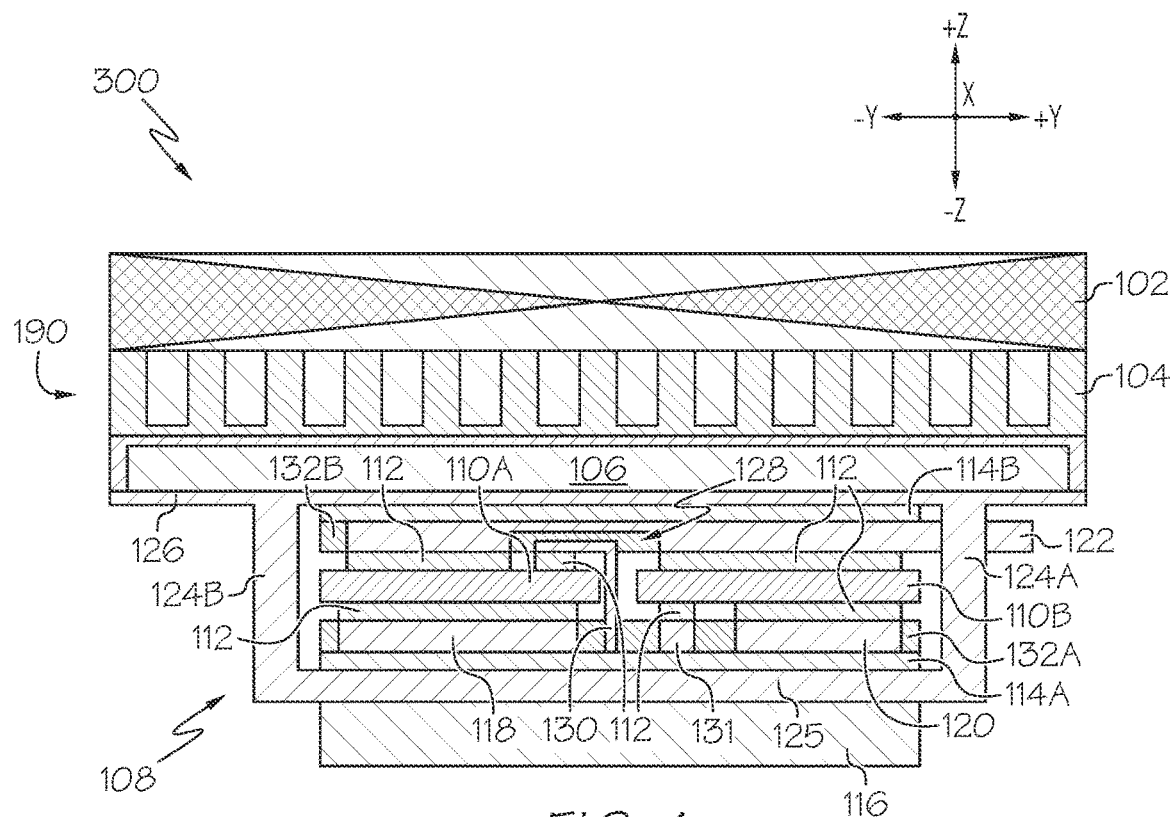
FIG. 4 schematically depicts a cross section of a power module of the power electronic assembly of FIG. 1 taken along line A-A, according to one or more embodiments shown and described herein.

With reference now to FIG. 4, an alternative embodiment of a power module 300 is depicted. The power module 300 of FIG. 4 may be the same as the power module 100 of FIG. 3 in all respects except as discussed herein. The power module 300 comprises thermal spreader 108. The thermal spreader 108 comprises the first portion 125 positioned between the power electronic devices 110A, 110B and the gate drive electronics 116 and the second portion 126 positioned between the power electronic devices 110A, 110B and the cooling assembly 190. The thermal spreader 108 further comprises a third portion 124B and a fourth portion 124A that both thermally couple the first portion 125 to the second portion 126. The third portion 124B is positioned between the first portion 125 and the second portion 126 and laterally positioned from the left-most edge (e.g. in the −y direction of the coordinate axes of FIG. 4) of the power electronic device 110A. The fourth portion 124A is positioned between the first portion 125 and the second portion 126 and laterally positioned from the right-most edge of the power electronic device 110B. Therefore, the second portion 126 of the thermal spreader 108 may draw heat from the first portion 125 of the thermal spreader 108 through both the third portion 124B and the fourth portion 124A.

Still with reference to FIG. 4, the power module 300 includes an oversized cooling assembly 190. The vapor chamber 106, heat sink 104, and fan 102 may continuously, horizontally extend (e.g. in the direction of the y-axis of the coordinate axes of FIG. 4) a distance greater than the distance from the left-most edge (e.g. in the −y direction of the coordinate axes of FIG. 4) of the power electronic device 110A to the right-most edge (e.g. in the +y direction of the coordinate axes of FIG. 4) of the power electronic device 110B. More specifically, the left-most edge of the cooling assembly 190 may be positioned outward of the left-most edge of the power electronic device 110A (e.g. in the −y direction of the coordinate axes of FIG. 4), and the right-most edge of the cooling assembly 190 may be positioned outward of the right-most edge of the power electronic device 110B (e.g. in the +y direction of the coordinate axes of FIG. 4). The second portion 126 of the thermal spreader 108 may be identically oversized as the cooling assembly 190. In other words, the left-most edges (e.g. in the −y direction of the coordinate axes of FIG. 4) of the second portion 126 and the cooling assembly 190 align, and the right-most edges (e.g. in the +y direction of the coordinate axes of FIG. 4) of the second portion 126 and the cooling assembly 190 align. Therefore, a thermal communicative interface between the top surface (e.g. in the +z direction of the coordinate axes of FIG. 4) of the second portion 126 of the thermal spreader 108 and the bottom surface (e.g. in the −z direction of the coordinate axes of FIG. 4) of the cooling assembly 190 may be may be maximized.

Figure 5:
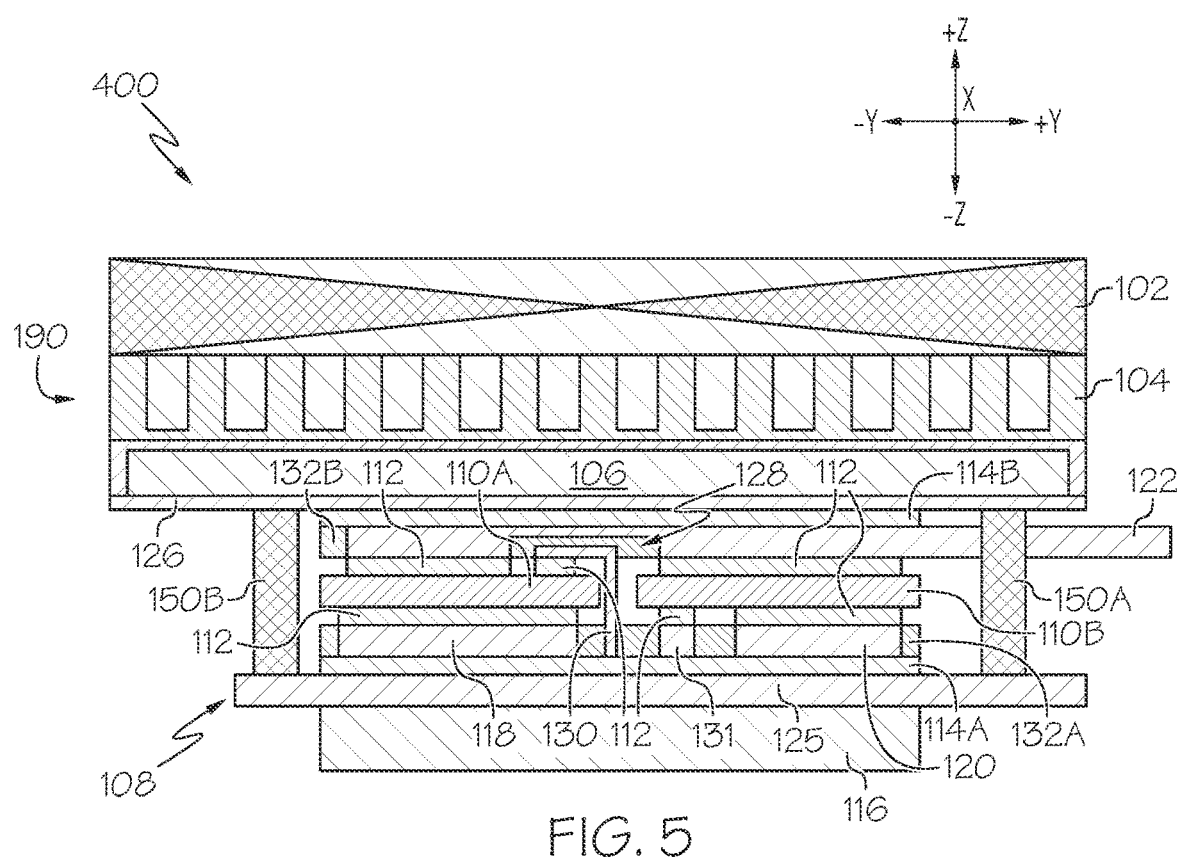
FIG. 5 schematically depicts a cross section of a power module of the power electronic assembly of FIG. 1 taken along line A-A, according to one or more embodiments shown and described herein.

Referring now to FIG. 5 an alternative embodiment of a power module 400 is depicted. The power module 400 of FIG. 5 may be the same as the power module 300 of FIG. 4 in all respects except as discussed herein. The thermal spreader 108 comprises the first portion 125 positioned between the power electronic devices 110A, 110B and the gate drive electronics 116 and the second portion 126 positioned between the power electronic devices 110A, 110B and the cooling assembly 190. The thermal spreader 108 further comprises a thermal strap 150B and a thermal strap 150A that both thermally couple the first portion 125 to the second portion 126. Therefore, the second portion 126 of the thermal spreader 108 may draw heat from the first portion 125 of the thermal spreader 108 through the thermal straps 150A, 150B. The thermal straps 150A, 150B may be a thermally conductive and flexible material. The thermal straps 150A, 150B may be copper, graphite, graphene, and the like. For instance, the thermal straps 150A, 150B may be one or more thermally conductive, compliant wires able to expand and move to accommodate thermal expansion and contraction of the components of the power module 400. In other words, as the power module 400 heats, one or more of the power electronic devices 110A, 110B, the one or more bonding agents 112, the busbars 118, 120, 122, and the electric insulation layers 114A, 114B may expand. The thermal straps 150A, 150B may expand along with the power module 400 components, accommodating for any changes in the shape and/or size of the power module 400. Similarly, as the power module 400 cools, one or more of the power electronic devices 110A, 110B, the one or more bonding agents 112, the busbars 118, 120, 122, and the electric insulation layers 114A, 114B may contract. The thermal straps 150A, 150B may contract along with the power module 400 components, accommodating for any changes in the shape and/or size of the power module 400.

Figure 6:
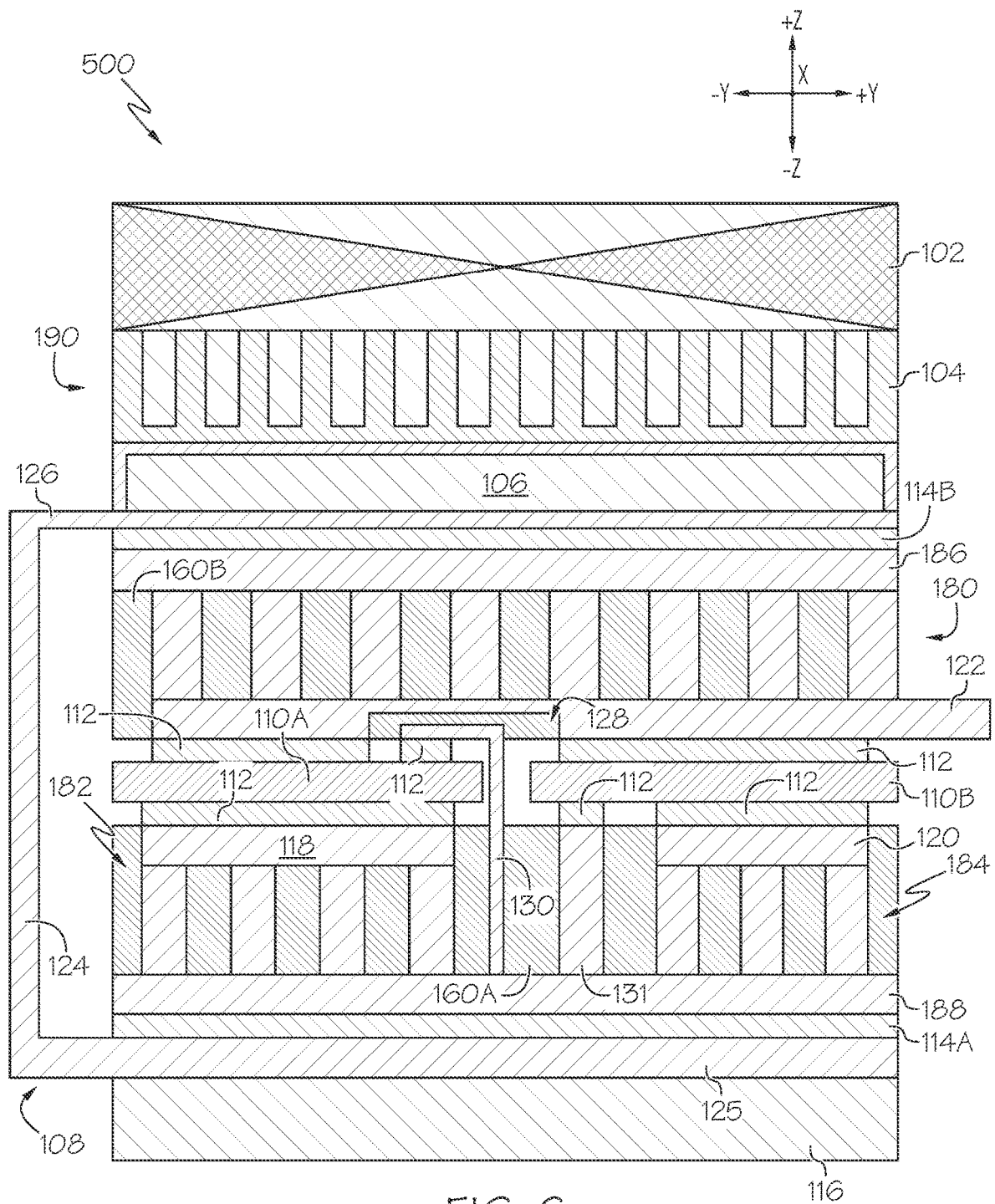
FIG. 6 schematically depicts a cross section of a power module of the power electronic assembly of FIG. 1 taken along line A-A, according to one or more embodiments shown and described herein.

With reference now to FIG. 6, an alternative embodiment of a power module 500 is depicted. The power module 500 of FIG. 6 may be the same as the power module 100 of FIG. 3 in all respects except as discussed herein. The power module 500 comprises a printed circuit board (PCB) and a plurality of electrically conductive vias embedded in the PCB. The PCB may be composed of a flame-retardant composite material formed from glass fiber reinforced epoxy resin such as, but not limited to, FR-4. In other embodiments, the PCB may be composed of a ceramic material capable of withstanding temperatures in excess of 250° C. such as, but not limited to, an Low Temperature Co-fired Ceramic (LTCC) material or aluminum oxide.

A first section of PCB 160A extends between the power electronic devices 110A, 110B and the first electric insulation layer 114A. More specifically, the first section of PCB 160A may extend between the one or more bonding agents 112 coupling the P busbar 118 and the N busbar 120 to the bottom surfaces (e.g. in the −z direction of the coordinate axes of FIG. 6) of the power electronic devices 110A, 110B. Therefore, the P busbar 118 and the N busbar 120 may be at least partially embedded in the first section of PCB 160A. The L-shaped via 130 and the via 131 may also be at least partially embedded in the first section of PCB 160A. A plurality of vertical (e.g. in the direction of the z-axis of the coordinate axes of FIG. 6) vias 182, 184 and one or more horizontal (e.g. in the direction of the y-axis of the coordinate axes of FIG. 6) vias 188 may be embedded in the first section of PCB 160A and provide electrical connections to or from one or more components of the power module 500 and/or power electronic assembly 200 (depicted in FIGS. 1 and 2).

A second section of PCB 160B extends between the power electronic devices 110A, 110B and the second electric insulation layer 114B. More specifically, the second section of PCB 160B may extend between the one or more bonding agents 112 coupling the O busbar 122 to the top surfaces (e.g. in the +z direction of the coordinate axes of FIG. 6) of the power electronic devices 110A, 110B. Therefore, the O busbar 122 may be at least partially embedded in the second section of PCB 160B. The L-shaped via 130 may also be at least partially embedded in the second section of PCB 160B. A plurality of vertical (e.g. in the direction of the z-axis of the coordinate axes of FIG. 6) vias 180 and one or more horizontal (e.g. in the direction of the y-axis of the coordinate axes of FIG. 6) vias 186 may be embedded in the second section of PCB 160B and provide electrical connections to or from one or more components of the power module 500 and/or power electronic assembly 200 (depicted in FIGS. 1 and 2).

Figure 7:
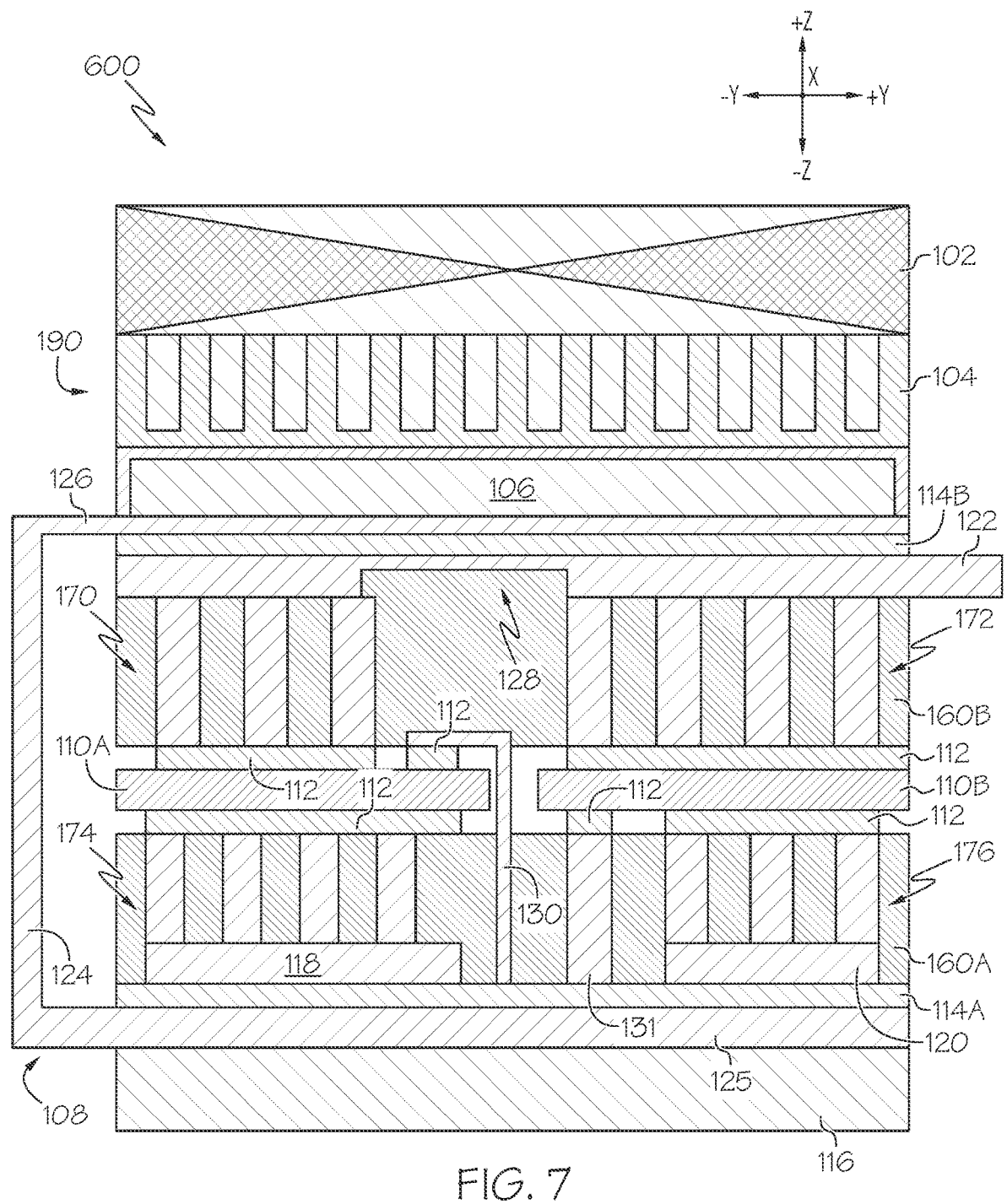
FIG. 7 schematically depicts a cross section of a power module of the power electronic assembly of FIG. 1 taken along line A-A, according to one or more embodiments shown and described herein.

Referring now to FIG. 7, an alternative embodiment of a power module 600 is depicted. The power module 600 of FIG. 7 may be the same as the power module 500 of FIG. 6 in all respects except as discussed herein. The first section of PCB 160A extends between the power electronic devices 110A, 110B and the first electric insulation layer 114A. More specifically, the first section of PCB 160A may extend between one or more bonding agents 112, such as, but not limited to, solder, which couple the first section of PCB 160A to the bottom surfaces (e.g. in the −z direction of the coordinate axes of FIG. 6) of the power electronic devices 110A, 110B, and the first electric insulation layer 114A. Bottom surfaces (e.g. in the −z direction of the coordinate axes of FIG. 6) of the P busbar 118 and the N busbar 120 may be coupled to the first electric insulation layer 114A. Therefore, the P busbar 118 and N busbar 120 may be at least partially embedded in the first section of PCB 160A. More specifically, the P busbar 118 and N busbar 120 may be at least partially embedded in the first section of PCB 160A such that the top surfaces (e.g. in the +z direction of the coordinate axes of FIG. 6) of the P busbar 118 and N busbar 120 are separated from the bottom surfaces (e.g. in the −z direction of the coordinate axes of FIG. 1) of the power electronic devices 110A, 110B by a length of the first section of PCB 160A. The L-shaped via 130 and the via 131 may also be at least partially embedded in the first section of PCB 160A. A first set of vias 174 vertically extend (e.g. in the direction of the z-axis of the coordinate axes of FIG. 6) from the top surface (e.g. in the +z direction of the coordinate axes of FIG. 6) of the P busbar 118 to the bottom surface (e.g. in the −z direction of the coordinate axes of FIG. 6) of the one or more bonding agents 112 coupling the power electronic device 110A to the first section of PCB 160A, such that the first set of vias 174 electrically couple the P busbar 118 to the power electronic device 110A. While the first set of vias 174 is depicted as a plurality of vias, in some embodiments, a single via may electrically couple the P busbar 118 to the power electronic device 110A. A second set of vias 176 vertically extend (e.g. in the direction of the z-axis of the coordinate axes of FIG. 6) from the top surface (e.g. in the +z direction of the coordinate axes of FIG. 6) of the N busbar 120 to the bottom surface (e.g. in the −z direction of the coordinate axes of FIG. 6) of the one or more bonding agents 112 coupling the power electronic device 110B to the first section of PCB 160A, such that the second set of vias 176 electrically couple the N busbar 120 to the power electronic device 110B. While the second set of vias 176 is depicted as a plurality of vias, in some embodiments, a single via may electrically couple the N busbar 120 to the power electronic device 110B.

The second section of PCB 160B extends between the power electronic devices 110A, 110B and the second electric insulation layer 114B. More specifically, the second section of PCB 160B may extend between one or more bonding agents 112, such as, but not limited to, solder, which couple the second section of PCB 160B to the top surfaces (e.g. in the +z direction of the coordinate axes of FIG. 6) of the power electronic devices 110A, 110B, and the second electric insulation layer 114B. The top surface (e.g. in the +z direction of the coordinate axes of FIG. 6) of the O busabr 122 may be coupled to the second electric insulation layer 114B. Therefore, the O busbar 122 may be at least partially embedded in the second section of PCB 160B. More specifically, the O busbar 122 may be at least partially embedded in the second section of PCB 160B such that the bottom surface (e.g. in the −z direction of the coordinate axes of FIG. 6) of the O busbar 122 is separated from the top surfaces (e.g. in the +z direction of the coordinate axes of FIG. 6) of the power electronic devices 110A, 110B by a length of the second section of PCB 160B. The L-shaped via 130 may also be at least partially embedded in the second section of PCB 160B. A third set of vias 170 vertically extend (e.g. in the direction of the z-axis of the coordinate axes of FIG. 6) from the bottom surface (e.g. in the −z direction of the coordinate axes of FIG. 6) of the O busbar 122 to the top surface (e.g. in the +z direction of the coordinate axes of FIG. 6) of the one or more bonding agents 112 coupling the power electronic device 110A to the second section of PCB 160B, such that the third set of vias 170 electrically couple the O busbar 122 to the power electronic device 110A. While the third set of vias 170 is depicted as a plurality of vias, in some embodiments, a single via may electrically couple the O busbar 122 to the power electronic device 110A. A fourth set of vias 172 vertically extend (e.g. in the direction of the z-axis of the coordinate axes of FIG. 6) from the bottom surface (e.g. in the −z direction of the coordinate axes of FIG. 6) of the O busbar 122 to the top surface (e.g. in the +z direction of the coordinate axes of FIG. 6) of the one or more bonding agents 112 coupling the power electronic device 110B to the second section of PCB 160B, such that the fourth set of vias 172 electrically couple the O busbar 122 to the power electronic device 110B. While the fourth set of vias 172 is depicted as a plurality of vias, in some embodiments, a single via may electrically couple the O busbar 122 to the power electronic device 110B.

Figure 8:
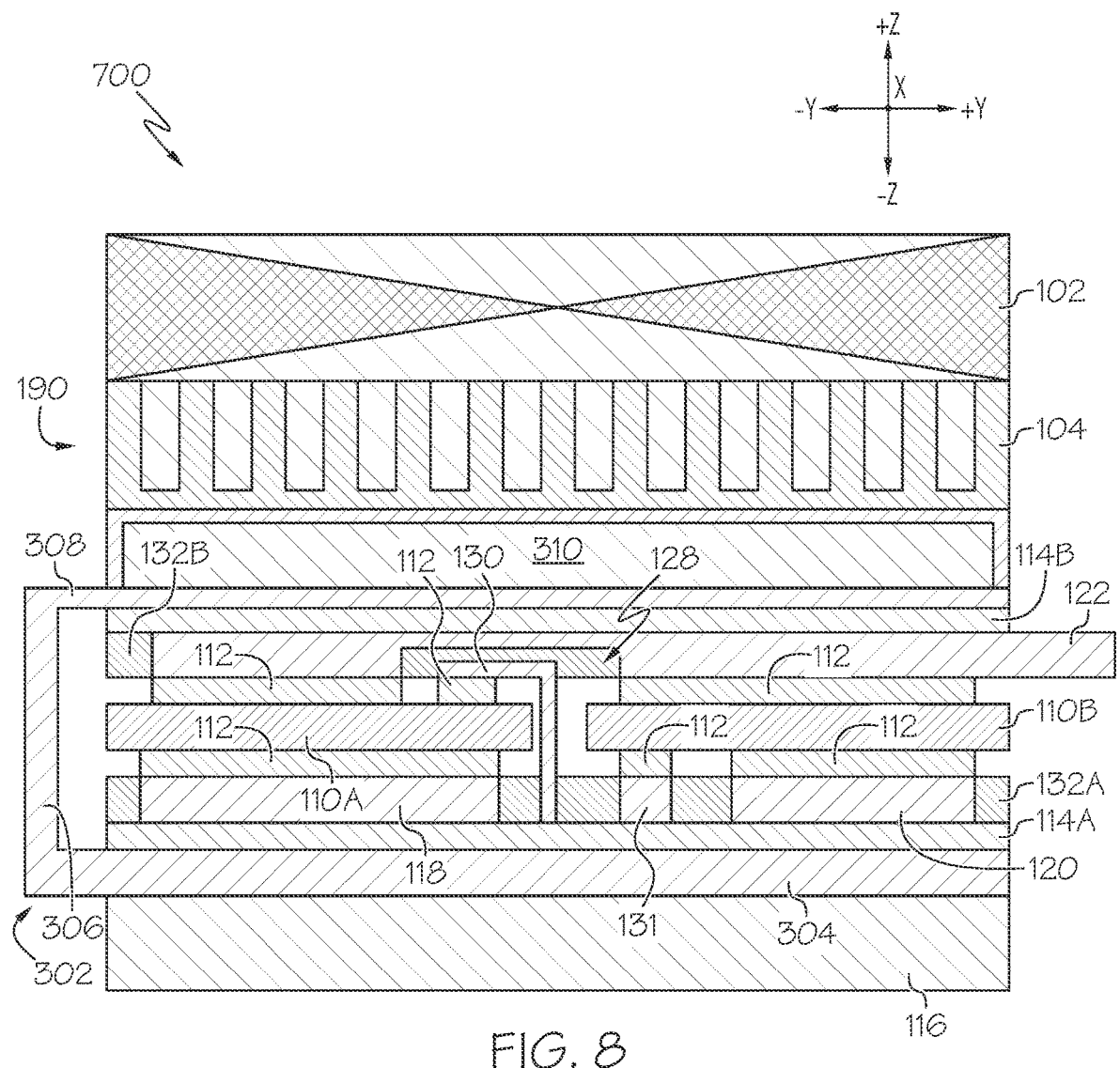
FIG. 8 schematically depicts a cross section of a power module of the power electronic assembly of FIG. 1 taken along line A-A, according to one or more embodiments shown and described herein.

With reference now to FIG. 8, an alternative embodiment of a power module 700 is depicted. The power module 700 of FIG. 8 may be the same as the power module 100 of FIG. 3 in all respects except as discussed herein. The thermal spreader 108 of the power module 100 (FIG. 1) is replaced with a vapor chamber 302. The vapor chamber 302 includes a first portion 304 that may be positioned substantially the same within the power module 700 as the first portion 125 of the thermal spreader 108 of the power module 100 (FIG. 3). The vapor chamber 302 includes a second portion 308 that may be positioned substantially the same within the power module 700 as the second portion 126 of the thermal spreader 108 of the power module 100 (FIG. 3). The vapor chamber 302 also includes a third portion 306 that may be positioned substantially the same within the power module 700 as the third portion 124 of the thermal spreader 108 of the power module 100 (FIG. 3).

The vapor chamber 302 functions as a two-phase cooler. The first portion 304 of the vapor chamber 302 may be thermally coupled to one or more components of the power module 700. For instance, the first portion 304 may draw heat from the gate drive electronics 116, the power electronic devices 110A, 110B, the P busbar 118, the N busbar 120, vias 130, 131, and any other components of the power module 700. The first portion 304 of the vapor chamber 302 is particularly positioned to be thermally coupled to and draw heat from the power electronic devices 110A, 110B and the gate drive electronics 116, active components of the power module 700 that generate large amounts of heat. More specifically, being positioned from the bottom surfaces (e.g. in the −z direction of the coordinate axes of FIG. 8), the first portion 304 of the vapor chamber 302 is positioned to draw heat from the bottom surfaces (e.g. in the −z direction of the coordinate axes of FIG. 8) of the power electronic devices 110A, 110B. The second portion 308 of the vapor chamber 302 may be thermally coupled to one or more components of the power module 700. For instance, the second portion 308 may draw heat from the power electronic devices 110A, 110B, the O busbar 122, the L-shaped via 130, and any other components of the power module 700. Being positioned from the top surfaces (e.g. in the +z direction of the coordinate axes of FIG. 8) of the power electronic devices 110A, 110B, the second portion 308 of the vapor chamber 302 is particularly positioned to draw heat from the top surfaces (e.g. in the +z direction of the coordinate axes of FIG. 8) of the power electronic devices 110A, 110B. The third portion 306 of the vapor chamber 302 thermally couples the first portion 304 to the second portion 308. The vapor chamber 302 includes a coolant fluid that transitions from a liquid to a gas when heated from one or more components of the power module 700. In operation, coolant in the second portion 308 of the vapor chamber 302 absorbs heat generated by the power module 700, and particularly the power electronic devices 110A, 110B, boiling the coolant fluid. Coolant in the first portion 304 of the vapor chamber 302 absorbs heat generated by the power module 700, and particularly the power electronic devices 110A, 110B and the gate drive electronics 116, boiling the coolant fluid to a vapor, which is then transported to the second portion 308 by one or more wicking structures extending through the first portion 304, the third portion 306, and the second portion 308 of the vapor chamber 302.

The cooling assembly 190 of the power module 700 includes a condenser 310 that may be positioned substantially the same within the power module 700 as the vapor chamber 106 of the power module 100 (FIG. 3). The condenser 310 may be mechanically and thermally coupled to the second portion 308 of the vapor chamber 302. Therefore, the coolant, in vapor form, of the vapor chamber 302 is condensed to a liquid at the condenser 310. The coolant, therefore, thermally transfers the heat absorbed from the power module 700 to the condenser 310. The coolant, after transitioning to a liquid form from a vapor form at the condenser 310, flows back through the vapor chamber 302 via the wicking structure in the vapor chamber 302. The heat sink 104 of the cooling assembly 190 is mechanically and thermally coupled to the condenser 310, and the fan 102 is mechanically and thermally coupled to the heat sink 104. Therefore, the heat sink 104 and fan 102 function to remove heat from the condenser 310, and therefore, the power module 700, similar to the heat sink 104 and fan 102 in relation to the vapor chamber 106 discussed with reference to FIG. 3.

Figure 9:
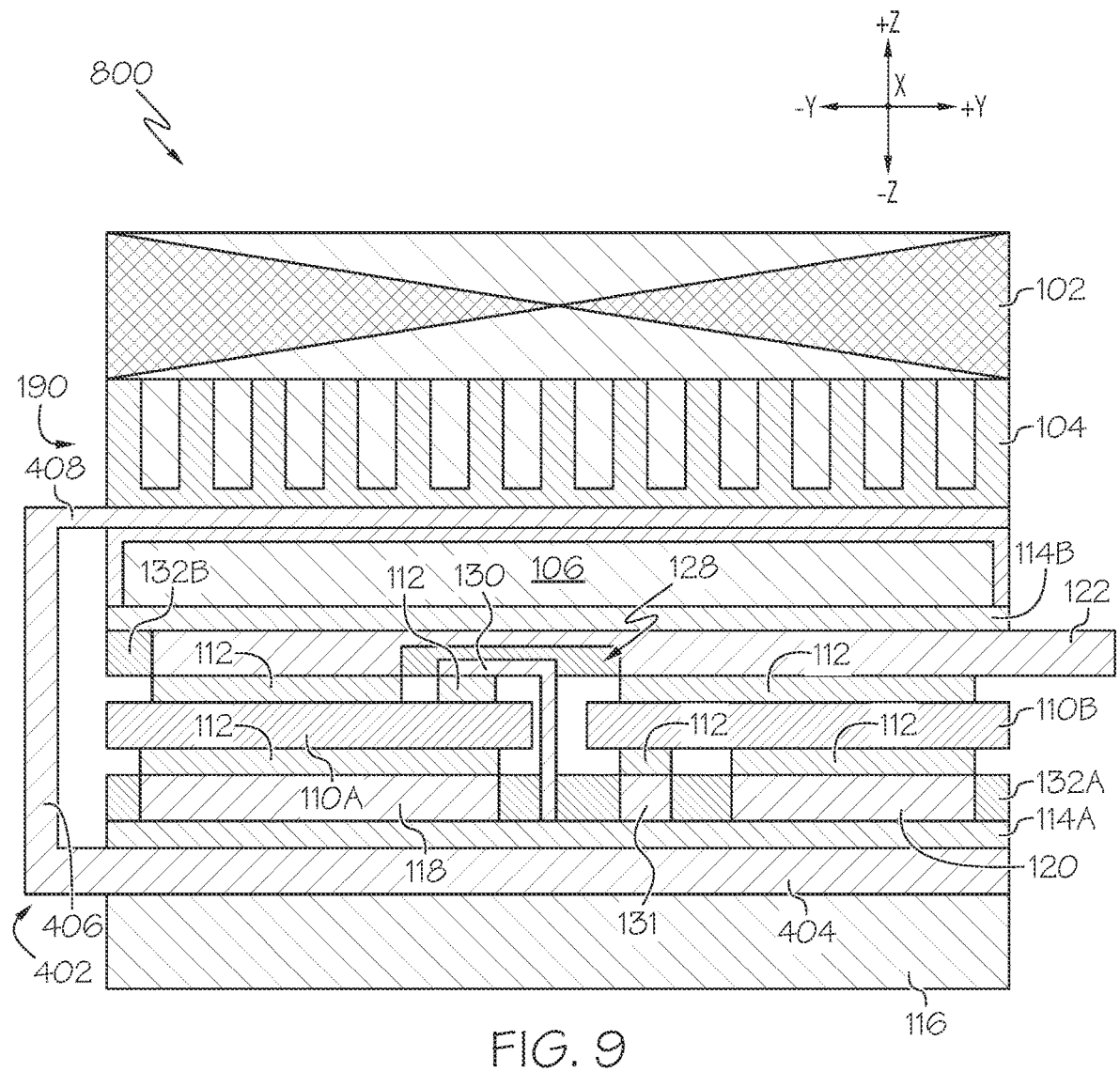
FIG. 9 schematically depicts a cross section of a power module of the power electronic assembly of FIG. 1 taken along line A-A, according to one or more embodiments shown and described herein.

With reference now to FIG. 9, an alternative embodiment of a power module 800 is depicted. The power module 800 of FIG. 9 may be the same as the power module 700 of FIG. 8 in all respects except as discussed herein. The power module 800 includes a heat pipe 402, which includes a first portion 404, a second portion 408, and a third portion 406. The first portion 404 may act as an evaporator portion, the second portion 408 may act as a condenser portion, and the third portion 406 may act as a central adiabatic portion coupling the first portion 404 and the second portion 408. A wicking structure made of sintered particles (for example, in the 90-106 μm size range) of a metal or a metal alloy, such as nickel, copper, molybdenum, niobium, aluminum, iron, cobalt, and/or titanium, may extend through the first portion 404, second portion 408, and third portion 406 of the heat pipe 402. The wicking structure may be uniformly porous in nature and responsible for holding and pumping a coolant between the first portion 404 and the second portion 408 by capillary action.

The first portion 404 of the heat pipe 402 is thermally coupled to one or more components of the power module 800. For instance, the first portion 404 may draw heat from the gate drive electronics 116, the power electronic devices 110A, 110B, the P busbar 118, the N busbar 120, vias 130, 131, and any other components of the power module 800. The first portion 404 of the heat pipe 402 is particularly positioned to be thermally coupled to and draw heat from the power electronic devices 110A, 110B and the gate drive electronics 116, active components of the power module 800 that generate large amounts of heat. More specifically, being positioned from the bottom surfaces (e.g. in the −z direction of the coordinate axes of FIG. 9) of the power electronic devices 110A, 110B, the first portion 404 of the heat pipe 402 is positioned to draw heat from the bottom surfaces (e.g. in the −z direction of the coordinate axes of FIG. 9) of the power electronic devices 110A, 110B. The heat absorbed by the first portion 404 may boil the coolant within the first portion 404, transitioning the coolant from a liquid to a vapor. The vapor then flows from the first portion 404, through the third portion 406, to the second portion 408.

The second portion 408 may be mechanically and thermally coupled to the heat sink 104, which acts as a condenser for the vapor transported to the second portion 408 of the heat pipe 402. Therefore, the coolant, in vapor form, releases its absorbed heat from the power electronic devices 110A, 110B and the gate drive electronics 116 to the heat sink 104. In doing so, the coolant transitions from a vapor to a liquid in the second portion 408 of the heat pipe 402. The coolant, in liquid form, is then carried back to the first portion 404 by the wicking structures through the third portion 406 by capillary action.

The power module 800 further includes a vapor chamber 106 positioned between the second electric insulation layer 114B and the second portion 408 of the heat pipe 402, and therefore positioned between the top surfaces (e.g. in the +z direction of the coordinate axes of FIG. 9) of the power electronic devices 110A, 110B and the bottom surface (e.g. in the −z direction of the coordinate axes of FIG. 9) of the heat sink 104. The vapor chamber 106 may be thermally coupled to one or more components of the power module 800. For instance, the vapor chamber 106 may draw heat from the power electronic devices 110A, 110B, the O busbar 122, the L-shaped via 130, and any other components of the power module 800. Being positioned from the top surfaces (e.g. in the +z direction of the coordinate axes of FIG. 9) of the power electronic devices 110A, 110B, the vapor chamber 106 is particularly positioned to draw heat from the top surfaces (e.g. in the +z direction of the coordinate axes of FIG. 1) of the power electronic devices 110A, 110B. The vapor chamber 106 may be thermally coupled to the heat sink 104. A coolant of the vapor chamber 106 changes from a liquid to a gas when heated from the power electronic devices 110A, 110B. The coolant, in vapor form, then condenses to a liquid on a condenser plate of the vapor chamber 106, which is thermally coupled to the heat sink 104. Therefore, the coolant, condensing from a vapor to a liquid, thermally transfers the heat initially absorbed from the power electronic devices 110A, 110B to the heat sink 104.

The heat sink 104 is thermally coupled to, and conveys heat to, the fan 102 as discussed with reference to FIG. 3. The cooling assembly 190 provides double-sided cooling of the power module 800, as the heat pipe 402 conveys heat from the gate drive electronics 116 and the bottom surfaces (e.g. in the −z direction of the coordinate axes of FIG. 9) of the power electronic devices 110A, 110B to the heat sink 104, and the vapor chamber 106 conveys heat from the top surfaces (e.g. in the +z direction of the coordinate axes of FIG. 9) of the power electronic devices 110A, 110B to the heat sink 104.

It should now be understood that embodiments described herein are directed to high-density power electronic assemblies that include one or more power modules that further include tightly integrated power electronic devices and gate drive electronics. The power electronics assembly further includes a cooling structure configured to provide double-sided cooling of the power modules by means of one or more thermal spreaders. The thermal spreaders are configured to convey heat from the gate drive electronics, positioned at the bottom of the power module, the bottom surfaces of the power electronic devices, and the top surfaces of the power electronic devices to the cooling assembly, which removes the heat from the power module and power electronic assembly.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An integrated power electronic assembly comprising:
   a power electronic device;
   a cooling assembly offset from and thermally coupled to a thermal spreader, the thermal spreader further comprising:
      a first portion offset from and thermally coupled to a first edge of the power electronic device;
      a second portion offset from and thermally coupled to a second edge of said power electronic device;
      a third portion thermally coupling the first and second portions, wherein:
         the first edge of the power electronic device is opposite the second edge of the power electronic device; and
   gate drive electronics, wherein:
      the gate drive electronics are offset from the first edge of the power electronic device;
      the thermal spreader is positioned between the first edge of the power electronic device and the gate drive electronics;
      the first portion is positioned between the first edge of the power electronic device and the gate drive electronics;
      the second portion is positioned between the second edge of the power electronic device and the cooling assembly; and
      the third portion thermally couples the first portion and the second portion.

2. The integrated power electronic assembly of claim 1, wherein the cooling assembly further comprises:
   a vapor chamber;
   a heat sink; and
   a fan, wherein:
      the vapor chamber, the heat sink, and the fan are thermally coupled with each other.

3. The integrated power electronic assembly of claim 2, wherein:
   the vapor chamber, the heat sink, and the fan are stacked such that the vapor chamber is nearest the second edge of the power electronic device, and the fan is farthest from the second edge of the power electronic device.

4. The integrated power electronic assembly of claim 3, wherein the thermal spreader is thermally coupled to the vapor chamber of the cooling assembly.

5. The integrated power electronic assembly of claim 1, wherein the third portion comprises a flexible thermal strap.

6. An integrated power electronic assembly comprising:
   a first power electronic device;
   a second power electronic device;
   a cooling assembly offset from second edges of the first and second power electronic devices;
   gate drive electronics offset from first edges of the first and second power electronic devices, wherein the first edges are opposite the second edges; and
   a thermal spreader, the thermal spreader further comprising:
      a first portion coupled to the gate drive electronics;
      a second portion coupled to the cooling assembly; and
      a third portion coupled between the first portion and the second portion, wherein;
         the first portion of the thermal spreader is positioned between the first edges of the first and second power electronic devices and the gate drive electronics; and
         the second portion of the thermal spreader is positioned between the second edges of the first and second power electronic devices and the cooling assembly.

7. The integrated power electronic assembly of claim 6, wherein the second portion of the thermal spreader is coupled to a vapor chamber of the cooling assembly.

8. The integrated power electronic assembly of claim 6, wherein:
   the first power electronic device and the second power electronic device are positioned in the same plane; and
   the first power electronic device and the second power electronic device are laterally offset from each other.

9. The integrated power electronic assembly of claim 6 further comprising:
   a P busbar soldered to the first power electronic device and positioned between the first edge of the first power electronic device and the first portion of the thermal spreader;
   an N busbar soldered to the second power electronic device and positioned between the first edge of the second power electronic device and the first portion of the thermal spreader; and
   an O busbar soldered to the second edges of the first and second power electronic devices and positioned between the second edges of the first and second power electronic devices and the second portion of the thermal spreader.

10. The integrated power electronic assembly of claim 9, wherein:
    the O busbar comprises an internal cutout; and
    an L-shaped via is soldered to the first power electronic device and positioned within the internal cutout of the O busbar.

11. The integrated power electronic assembly of claim 6, wherein:

a printed circuit board separates the first and second power electronic devices from input and output busbars of the integrated power electronics assembly; and a plurality of vias connect the first and second power electronic devices to the input and output busbars.

12. The integrated power electronic assembly of claim 6, wherein the thermal spreader comprises copper or copper-graphite.

13. The integrated power electronic assembly of claim 6, wherein a distance from a first lateral edge of the cooling assembly to a second lateral edge of the cooling assembly is greater than a distance from an outer lateral edge of the first power electronic device to an outer lateral edge of the second power electronic device.

14. The integrated power electronic assembly of claim 6, wherein:

the thermal spreader comprises a vapor chamber;

the cooling assembly comprises a condenser; and the second portion of the thermal spreader is coupled to the condenser.

15. An integrated power electronic assembly comprising:

a power electronic device;

a cooling assembly offset from a first edge of the power electronic device, the cooling assembly comprising:

a vapor chamber;

a heat sink; and a fan, wherein:

the vapor chamber is positioned between and thermally coupled to the power electronic device and the heat sink;

the heat sink is positioned between the vapor chamber and the fan; and the fan is thermally coupled to the heat sink;

gate drive electronics offset from a second edge of the power electronic device, wherein the first edge is opposite the second edge; and a heat pipe, the heat pipe further comprising:

a first portion positioned between the gate drive electronics and the first edge of the power electronic device, wherein a coolant transitions from a liquid to a vapor in the first portion;

a second portion positioned between the cooling assembly and the second edge of the power electronic device, wherein the coolant transitions from a vapor to a liquid in the second portion; and a third portion coupled between the first portion and the second portion, wherein the coolant is wicked between the first portion and the second portion through the third portion.

16. The integrated power electronics assembly of claim 15, wherein the second portion of the heat pipe is coupled to a heat sink of the cooling assembly.

* * * * *